United States Patent [19]

Peil et al.

[11] B  3,999,138
[45] Dec. 21, 1976

[54] DETECTOR FOR AM-FM SIGNALS

[75] Inventors: William Peil, North Syracuse; Robert J. McFadyen, Syracuse, both of N.Y.

[73] Assignee: General Electric Company, Syracuse, N.Y.

[22] Filed: Apr. 7, 1975

[21] Appl. No.: 565,717

[44] Published under the second Trial Voluntary Protest Program on April 13, 1976 as document No. B 565,717.

Related U.S. Application Data

[63] Continuation-in-part of Ser. No. 457,908, April 4, 1974, abandoned.

[52] U.S. Cl. .............................. 329/2; 307/233 R; 307/235 R; 325/317; 329/101; 329/103; 329/138; 329/142; 329/147; 330/30 D
[51] Int. Cl.$^2$ ..................... H03D 3/22; H03D 5/00
[58] Field of Search ............. 329/2, 101, 103, 135, 329/137, 138, 142, 147; 307/233 R, 235 R; 325/315–317

[56] References Cited
UNITED STATES PATENTS 3,022,461  2/1962  Wilcox, Jr. .................... 329/103
3,519,944  7/1970  Avins .......................... 329/103

FOREIGN PATENTS OR APPLICATIONS 18,162  6/1970  Japan ............................ 325/315

Primary Examiner—Siegfried H. Grimm
Attorney, Agent, or Firm—Marvin A. Goldenberg

[57] ABSTRACT

A detector for AM or FM signals is described. The detector employs a differentially connected emitter follower pair to which an in-phase and a phase-shifted signal are respectively applied. The emitter follower pair produces an output waveform with controllably spaced zero crossings which is the "greater of" the applied waveforms. For FM operation, the phase shift is made linearly frequency dependent, being in quadrature at resonance. In FM operation, the zero crossings are sensed to produce a succession of variable width unidirectional pulses whose widths are proportional to the frequency deviation. Amplitude variations in the variable width pulses may then be removed and integration in a filter with an audio frequency time constant recovers the FM modulation information. For AM operation, a phase shift of 180° is used, producing full wave rectification. The AM information is then recovered from the rectified signal using the same integrating filter used for FM. The invention has preferred application to integrated circuit fabrication.

23 Claims, 4 Drawing Figures

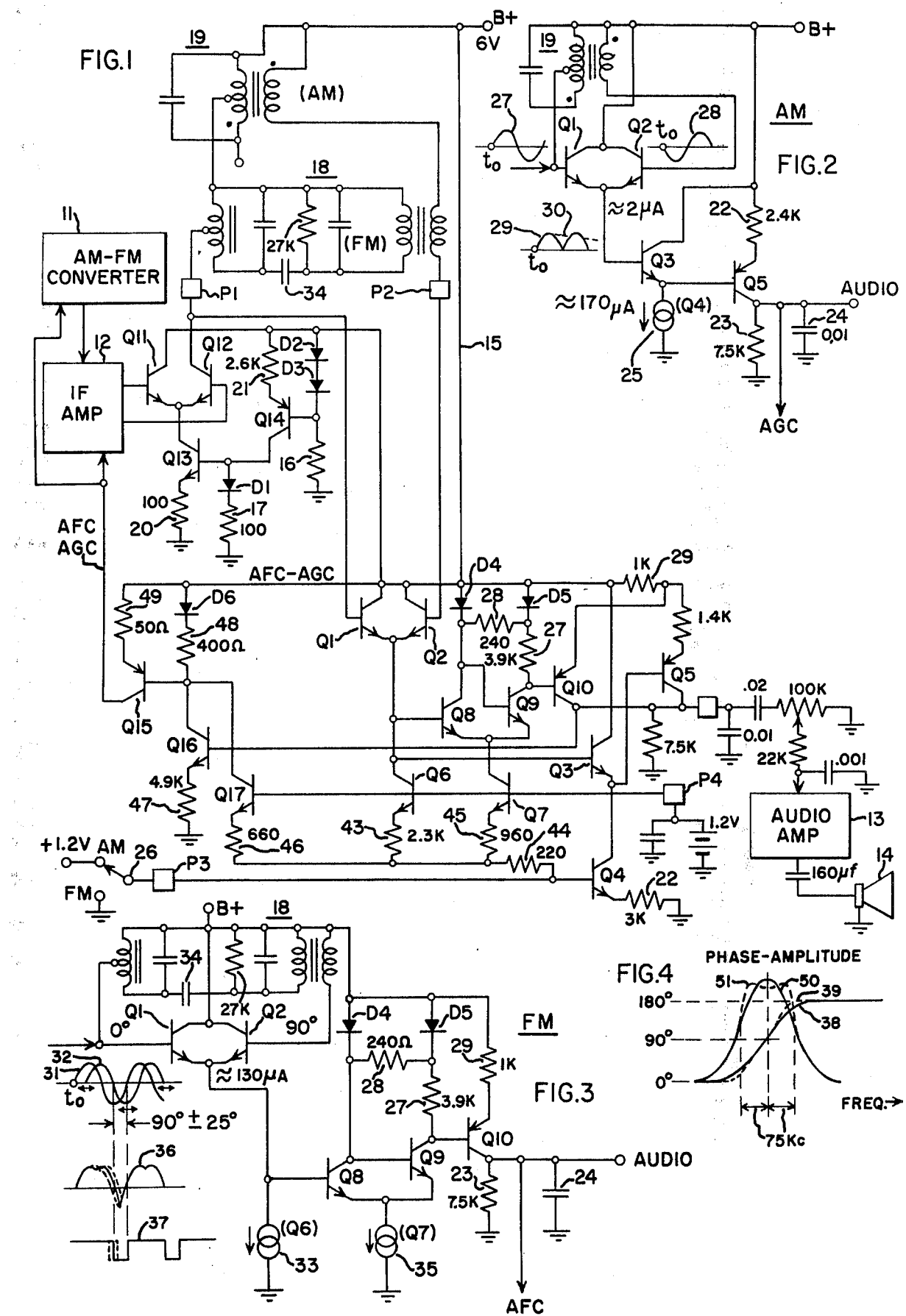

DETECTOR FOR AM-FM SIGNALS

This is a continuation-in-part of application, Ser. No. 457,908, filed Apr. 4, 1974, and now abandoned.

BACKGROUND OF THE INVENTION

1. Field of the Invention

The present invention relates to detection and more particularly to a detection network which is convertible for operation on either an amplitude modulated signal or on a frequency modulated signal. The invention also relates to a detection circuit suitable for integrated circuit fabrication.

2. Description of the Prior Art

A known FM demodulator obtains a quantity containing the modulation information by employing a pair of tuned circuits to form a pair of quadraturely related signal components and by employing a pair of diodes to rectify the resultants, derived by combining these phase components. In this known FM demodulator, one signal component is of reference phase and another signal component has a phase which is a linear function of the frequency deviation, being in quadrature at resonance. These two components are combined to form a first resultant, which is applied to one diode and combined to form a second resultant which is applied to the other diode. Thus, a pair of resultant vectors are created whose inequality reflects the frequency deviation. After rectification by the diodes, the d.c. components of the resultant vectors may be substracted to obtain an output quantity replicating the modulation information.

Another known FM demodulator employs two quadrature waves and gating to produce variable width output pulses which are later integrated. In this demodulator, gating is performed by a gated beam tube having a pair of control grids, each capable of cutting off conduction. The in-phase signal is applied to a first control grid and a quadrature signal is developed on a second control grid the quatrature component being self-generated in a auxiliary resonant circuit. Thus, depending upon whether the input signal is above or below the resonant frequency of the auxiliary resonant circuit, the phase relationship will vary about quadrature and cause a variation in the period when both grids permit conduction. Assuming a conduction angle of 90° at resonance, the conduction period is arranged to fall as the frequency increases above resonance and to rise as the frequency falls below resonance. Thus, a sequence of variable width pulses is produced, whose width is proportional to the frequency deviation of the signal. If these pulses are integrated at an audio rate, the modulation information may be recovered. While sound in principle, this vacuum tube demodulator is uneconomical and obsolete for most applications today.

More recently, FM demodulators in integrated circuit form have employed two-quadrant and four-quadrant multiplier circuits in which the quadrature related components are applied respectively to the upper and lower ranks of the multipliers. These multipliers often exhibit substantial phase shifts due to unavoidable parasitics between signals coupled to the lower and to the upper ranks. These phase shifts also change as a function of the signal level. Thus, if the device is optimized for normal signal levels, one obtains relatively poor low signal performance. A disadvantage particularly of the two quadrant multiplier, is in the d.c. offset which may be added to the demodulated signal and which may affect the interchangeability of the resulting integrated circuits. In the two quadrant multiplier, the d.c. voltage offset at the input junctions is multiplied by the d.c. gain, and appears as a larger uncertainty in the d.c. output level.

SUMMARY OF THE INVENTION

Accordingly, it is an object of the present invention to provide an improved FM detector.

It is a further object of the present invention to provide an improved detector for FM or AM reception.

It is a further object of the invention to provide an improved FM detector intended for integrated circuit fabrication, and having minimum phase delay error between the inphase and quadrature signal components.

It is another object of the invention to provide an improved FM detector of the type producing variable width pulses which are later integrated to recover the audio modulation.

It is still a further object of the invention to provide an improved AM-FM detector intended for integrated circuit fabrication.

These and other objects of the present invention are achieved in a novel combination comprising a source of frequency modulated signals of predetermined center frequency; phase shift means for producing a substantially linear change of phase with frequency, the phase shift at the center frequency normally being approximately 90°; and a pair of unidirectionally conducting semiconductor means, in one preferable embodiment being in the form of a differentially connected emitter follower pair which comprises a pair of transistors with their collectors coupled to a bias source and their emitters returned to ground through a load impedance. An inphase signal is coupled to the base of one transistor and a phase shifted signal is coupled to the base of the other transistor of the emitter follower pair. The output waveform of the emitter follower pair represents the greater or predominant one of the input waveforms. The predominant input waveform will be the more positive valued input at any given instant in time for transistors of NPN type, and would be the more negative valued instantaneous input for transistors of PNP type. The output waveform has a portion of one polarity which is broad and double peaked and a portion of the other polarity which is narrow and single peaked with the widths at the zero crossing varying with the mutual phase separation of the two input waveforms.

The combination further comprises a zero crossing detector and an integrator. The zero crossing detector receives the output of the emitter follower pair and is adapted to form a succession of substantially rectangular, constant amplitude pulses having a duration substantially equal to the zero crossing interval. The integrator converts the variable width constant amplitude pulses to a time averaged waveform whose amplitude is proportional to the frequency deviation and which contains the original signal modulation information.

The phase shift means for FM operation may comprise a non-resonant element such as a delay line, or particularly for lower frequencies, a resonant element such as a piezoelectric resonator or aN LC circuit. In a preferred form, the phase shift means is a pair of parallel resonant LC circuits which are slightly overcoupled to increase the linear range of the phase response characteristic.

The zero crossing detector comprises a pair of transistors, the emitters being joined and coupled to a constant current source, and the collector of the first transistor being coupled to the base of the second transistor. These connections complete a first regenerative feedback, path, permitting the detector to reach one of the two limiting conditions at low signal excursions. The input signal is applied to the base of the first transistor and a squared output pulse is derived from the collector of the second transistor. A second degenerative feedback loop is provided from the collector of the second transistor to its base for greater circuit stability.

For FM and AM detection, the signal source selectively provides either frequency modulated signals of a first center frequency or amplitude modulated signals of a second center frequency. For frequency modulated signals, the phase shift means produces a substantially linear change of phase with frequency with a quadrature phase shift at the center frequency. For amplitude modulated signals, the phase shift means produces a phase inversion. When the FM signals are applied to the emitter follower pair, the FM output waveform is as described above. When AM signals are applied, the emitter follower pair produces full wave rectification. In the FM mode, the signal from the zero crossing detector is given further amplification and applied to the output integrating network. In the AM mode, the signal is derived from the emitter follower pair by a two stage amplifier comprising an emitter follower and a base input-emitter common stage, and the amplified AM signal is applied to the same integrating network as is used for the FM signal.

BRIEF DESCRIPTION OF THE DRAWING

The novel and distinctive features of the invention are set forth in the claims appended to the present application. The invention itself, however, together with further objects and advantages thereof may best be understood by reference to the following description and accompanying drawings in which:

FIG. 1 is a drawing partly in block and partly in electrical circuit diagram form of a superheterodyne receiver incorporating an AM-FM detector in accordance with the invention;

FIG. 2 is an equivalent circuit representation of the AM detection portion of the radio receiver illustrated in FIG. 1;

FIG. 3 is an equivalent circuit representation of the FM detection portion of the receiver illustrated in FIG. 1; and FIG. 4 is a graph illustrating both the amplitude response and the phase response as a function of frequency of the phase shift network used in FM detection.

DESCRIPTION OF A PREFERRED EMBODIMENT

A radio receiver embodying the invention is shown in the combined block and electrical circuit diagram of FIG. 1. The radio receiver of FIG. 1 is a superheterodyne receiver intended for AM-FM operation. The receiver has an AM-FM converter (block 11) and an IF amplifier functioning on two IF frequencies, all but one stage of which are included in block 12. The last stage of IF amplification is included in the circuit diagram portion of FIG. 1 which also includes the input filters for the AM-FM detector, the AM-FM detector itself, and the initial audio preamplification. The receiver is completed with an output audio amplifier (block 13,) and a capacitively coupled loudspeaker (14). Of particular interest is the AM-FM detector.

The radio receiver performs the conventional functions. The input signal is converted to one of a pair of intermediate frequencies in the AM-FM converter 11. The FM section of the converter is normally provided with an external connection for a whip or other suitable FM antenna. The AM section of the converter need have no external provision for signal reception since a ferrite element contained in the tuning unit normally provides adequate signal pick up. The FM section produces an output at a fixed intermediate frequency of conventionally 10.7 MHz, while the AM section produces an output at a fixed intermediate frequency of conventionally 455 KHz. Depending upon the mode setting, which may be accomplished by an ordinary, manually operated mode select switch, not shown with respect to the converter 11, an AM or FM signal is applied to the IF amplifier for signal separation and further amplification. The last stage of the IF amplifier, shown in the circuit diagram of FIG. 1, couples the amplified signal to the AM (19) and FM (18) filters at the detector input. The remainder of the electrical circuitry of FIG. 1 is allocated to the detection function, the provision of an automatic gain control voltage on AM, an automatic frequency control voltage on FM and audio preamplification. After preamplification, detected signals are coupled to the audio amplifier 13 and loudspeaker 14.

The last stage of intermediate frequency amplification comprises the differential transistor pair Q11, Q12 together with a stabilized emitter current supply. The signal derived from the IF amplifier stages contained in the block 12 is applied across the bases of Q11 and Q12. The amplified output is derived from the collector of Q12 which is coupled to the pad P1. The pad P1 is one input connection point to the detector filters 18, 19. The collector of Q11 is returned to the 6 volt B + bus 15. The emitters of Q11, Q12 are joined and provided with a constant emitter current ground return.

The current source for Q11, Q12 comprises transistors Q13, Q14, diodes D1, D2, D3, and sundry resistances. The constant emitter current is provided from the collector of Q13 whose emitter is led to ground through a 100 ohm resistance (20) and whose base emitter voltage is established by a reference coupled to its base. The reference for Q13 is established by a second current source including transistor Q14 whose collector is connected to the base of Q13 and returned to ground through a diode (D1) and resistance (17) in series. The emitter of Q14 is led through a current stabilizing (2.6K) resistor (21) to the B± bias source. The base potential of Q14 is established at approximately two diode drops (D2 + D3) below the B+ bus at a diode current level established by a resistance 16 returning the diodes to ground. The diodes D2 and D3 and resistance 16 thus establish the collector current of Q14 by Vbe control, and in turn the current in serially connected diode D1 and resistance 17. The current in diode D1 and resistance 17 is then replicated — also by Vbe control — in transistor Q13 which provides a stabilized emitter current for Q11, Q12. The current setting is typically at around 200 microamperes.

The signal supplied by the IF amplifier is applied to the AM and FM filters (19, 18 respectively) before application to the AM-FM detector comprising transistor pair Q1, Q2. The filters provide further channel separation and phase shift functions essential to the detection process. The differential transistor pair Q1, Q2 are used in both AM and FM detection. More specifically, the filters (19, 18) apply a filtered IF signal in two different phases to the bases of the differential transistor pair Q1, Q2. The pads P1 and P2 are connected respectively to the input and output connection points of the AM and FM filters while the B+ bus 15 is connected by a pad P5 to the "common" filter connection points. The common connection also completes a current path from the collector of IF amplifier transistor Q12 to B+. The FM filter is a double tuned circuit as shown at 18 having a parallel resonant tank circuit at the input and a parallel resonant tank circuit at the output, capacitively coupled by capacitor 34 to produce a 90° phase shift at resonance. The capacitor 34 is normally selected to produce a slight overcoupling beyond critical to reduce distortion. The FM filter is resonant at 10.7 MHz and has an input connection tapped on the input tank inductor. The AM filter 19 consists of a transformer having a tuned primary, also with a tapped input connection, and an untuned secondary with a phase inverting output connection. The tapped portions of the FM and AM input windings are thus serially connected between the pad P1 and the B+ bus and the output windings of the FM and AM filters are serially connected between the pad P2 and the B+ bus.

The circuitry involved in AM detection is illustrated with some simplification in FIG. 2. It includes the AM filter 19, the transistor pair Q1, Q2 performing the detection function, and the audio preamplifying transistors Q3, Q5, a constant current source 25 and sundry resistances and capacitances. The AM tank circuit 19 is shown with the input tap connected to the base of Q1 and the phase inverting output connection of the secondary connected to the base of Q2. The omission of the FM windings from the AM equivalent circuit is justified by the negligible impedance of the 10.7 MHz transformer at 455 KHz. The collectors of Q1 and Q2 are joined together and coupled to B+ bus 15 which is also the "common" RF connection of the primary and secondary windings of AM filter 19. The emitters of Q1, Q2 are joined together. As will be explained, the circuit configuration produces full wave rectification of the AM signal at the emitters of Q1, Q2, functioning in a peak detection mode.

The detected output is amplified in two following audio amplification stages. The first stage comprises the transistor Q3, connected in a high input impedance emitter follower configuration. Transistor Q3 has its base coupled to the emitters of Q1, Q2, its collector directly connected to the positive bias source 15 and its emitter coupled to ground through a constant current source 25 (comprising transistor Q4). The output derived from emitter follower Q3 is then applied to the base of transistor Q5 of the second amplifying stage. Transistor Q5 is connected in base input, emitter common configuration with its emitter led through a biasing resistance 22 to the B+ bus and its collector led through resistance 23 to ground. The amplified output signal appears at the collector of Q5. An RC network comprising resistance 23 and capacitor 24, connected between the collector of Q5 and ground, filters out any remaining components of intermediate frequency or higher harmonics. The amplified AM signal appearing at the collector of Q5 is now ready for final audio amplification. After further filtering, it is also ready for use as an automatic gain control voltage for the IF amplifier.

The current source 25, noted above, also participates in AM-FM mode selection. As illustrated in FIG. 1, the source 25 comprises the transistor Q4 having its collector connected to supply current to the emitter of Q3 and its emitter returned to ground through a resistance 22. A mode setting switch 26 connected to pad P3 provides a positive 1.2 volt base bias to Q4 in the AM position and a 0 volt base bias in the FM position. The mode setting switch 26 thus allows Q4 to supply a substantial current to Q3 during AM operation but during FM operation reduces the current to Q3 substantially to zero.

AM detection is by full wave rectification in a peak detection mode. Waveforms describing the rectification process are illustrated at 27, 28, 29 and 30 of FIG. 2. A first sinusoidal waveform 27 at IF frequency is applied to the base of Q1. A second sinusoidal waveform 28 at IF frequency, but of opposite phase to the waveform 27, is applied to the base of Q2. This opposing phase relationship is provided by reversal of the transformer output connections in the filter 19, as previously noted. The emitter current of Q1 and Q2 is held to a very low value by drawing its current from the base of Q3. This low current level is achieved by establishing the emitter current in emitter follower Q3 at about 170 microamperes corresponding to a base current of about 2 microamperes (depending upon the current gain of transistor Q3). If the signal goes negative on the base of one transistor of the differential pair (Q1, Q2), that transistor is cut off. If the signal goes positive, that transistor conducts at the current level available from the base of Q3. Thus, during the period that the base of Q1 is positive, a current may flow in the common emitter path and during the period that the base of Q2 is positive, a current may flow in the common emitter path. Thus, assuming a low impedance resistive load, a full wave rectified current reflecting the greater of the two signal voltages applied to the bases of Q1, Q2 will be produced in the common emitter path as represented by solid line waveform 29.

Detection occurs, however, in a peak detection mode, achieved by making the detector output circuit of high impedance and allowing appreciable stray capacity. The stray capacity results primarily from the collector-base capacity of Q3 and normally is on the order of 3 picofarads. Under these conditions, the conduction periods required to charge the stray capacity to the peak values of the applied input voltage are short and confined largely to near the peaks of the sinusoidal input voltage. The short charging waveforms are interspersed with long and more gradual discharging waveforms. The peak detection voltage is illustrated by dotted waveform 30 in FIG. 2. This waveform contains the audio signal modulation. The RC filter 23, 24 then removes the higher frequency harmonic terms and any traces of the IF carrier from the audio signal.

The circuitry involved in FM detection is illustrated in a simplified form in FIG. 3. It includes the FM filter 18; the transistor pair Q1, Q2, the transistor pair Q8, Q9 in a non-inverting modified differential amplifier configuration, and the base input, emitter common output amplifier Q10. The foregoing circuits convert the FM signal into variable width pulses, whose widths are proportional to the instantaneous frequency deviation of the signal, and which after integration contain the audio signal in the normal amplitude format. With suitable de-emphasis, the original audio modulation of the FM signal is obtained.

The FM filter 18 applies the signal to the transistor pair Q1, Q2. The input tap to the input resonant circuit of the filter is directly connected to the base of Q1. The output filter connection, which is phased at 90° (at resonance) with respect to the input drive, is directly connected to the base of Q2. The omission of AM windings from the FM equivalent circuit is justified by the low impedance properties of the 455 KHz AM transformer at 10.7 MHz. As in FIG. 2, the collectors of Q1, Q2 are joined together and coupled to the B+ bus which is also the common RF connection for the input and output tank circuits of the FM filter. The emitters of Q1, Q2 are joined together and in the FM mode are supplied current from the collector of current source 33 (transistor Q6). The emitters of Q1, Q2 are at the point at which a waveform 36 having variable width negative going portions is produced. These negative going portions are subsequently converted to variable width rectangular pulses whose widths are proportional to the instantaneous frequency deviation.

The waveform 36 is produced in Q1, Q2 in the following manner. The FM filter 18 applies waves to the bases of Q1, Q2 which have a phase separation of 90° for zero frequency deviation. The waveform 31 (shown in FIG. 3) is the input waveform from the input resonant circuit supplied to the base of Q1 and the waveform 32 is the output waveform from the output resonant circuit supplied to the base of Q2. The current levels in Q1, Q2 are set at about 130 microamperes by the constant current source 33 from which they derive their current. They are also arranged to operate linearly in respect to the input signal applied to their respective bases (i.e., no rectification by stray capacity). By virtue of the positive rectification action, the voltage output of the emitter followers follows the higher of the two input voltages. The "greater of" voltage output characteristic, which is shown at 36 and which assumes linearity in the input characteristic, is seen to have a relatively high and broad double peaked positive going portion and a shallower and narrower pointed negative going portion. The negative going portion, assuming a zero frequency deviation, is approximately 90° wide at the zero crossing, corresponding to a negative ¼ duty cycle, and a positive ¾ duty cycle.

At other than zero deviation, the output waveform will have a negative going portion that will be more or less than 90° as a function of the phase versus frequency characteristic of the FM tuned circuit. Assuming that capacitor 34 provides critical (or slightly over critical) coupling between the two resonant tank circuits, the amplitude waveforms will be as shown at 50 (or 51), and the phase will vary as shown in curve 38 (or 39) of FIG. 4 from about 65° to 70° for maximum negative frequency deviation to 110° to 115° for maximum positive frequency deviation. During the interval that both signals applied to the bases of Q1, Q2 are negative, a sharp or "peaked" negative going portion of waveform 36 is produced at the emitters of Q1 and Q2. The width of the negative going portion at zero crossing is determined by the mutual phase displacement of the two applied waveforms. When the waveforms 31, 32 are at minimum mutual displacement (65° – 70°), the peaked negative going portion is widest (being 110° – 115°), and when the waveforms 31, 32 are at maximum mutual displacement (110° – 115°), the peaked negative going portions are narrowest (being 65° – 70°). With audio modulation, the frequency deviation will vary between ± 75 KHz for maximum audio intensity, and the peaked negative going portions of waveform 36 will be produced at the intermediate frequency rate, having angular widths which vary 20° to 25° above and below an average of 90°. Larger phase variations are possible if higher distortions (over 1%) are acceptable.

In addition to having a variable width as a function of the frequency deviation, the peaked negative going portions of the waveform vary in amplitude. In the upper limit (i.e. 180° phase shift) a wave resembling full wave rectification is produced, in which the amplitude of the negative going portion is zero. In the lower limit (i.e., 0° phase shift), the amplitude of the negative going portion is essentially full amplitude. At 90° phase separation, the amplitude is 71% of full amplitude and a variation of ± 22.5° produces an amplitude range of 38 – 92% of the full amplitude. Accordingly, in applications where second order harmonics resulting from the undesired amplitude variation should be avoided, the output of Q1, Q2 should be processed by a zero crossing detector which removes the amplitude variations.

The differential amplifier Q8, Q9 ideally provides zero crossing detection by providing a high gain for small signal levels, with limiting action occuring before normal signal levels are reached. The idealized output waveform of Q8, Q9, neglecting integrative effects, is shown at 37.

The differential amplifier achieves a controlled high gain by use of both a regenerative and a degenerative feedback loop. The emitters of Q8, Q9 are joined and receive current from current source 35 (transistor Q7). The collector of Q8, which is coupled to the base of Q9 in the forward gain path, is coupled to the B+ bus through diode D4. The collector of Q9 is coupled to the B+ bus through resistance 27 in series with diode D5. The connection of the collector of Q8 to the base of Q9 transfers the signal from Q8 to Q9, and the common emitter coupling from Q9 back to Q8 completes the regenerative feedback path which is around both stages. The negative feedback path is from the collector of Q9 back to its base. The negative feedback path is from the cathode of diode D5 in the collector load of Q9 through a resistance 28 connected to the base of Q9 and around the second stage only. It tends to stabilize the gain of the amplifier. The signal output of the differential amplifier is derived from the collector of Q9. This arrangement gives a maximum gain of about 10 for small signals, the gain decreasing rapidly as limiting occurs for both positive and negative signal excursions.

The limiting action in Q8, Q9 is achieved by setting fixed positive and negative output states about the zero signal output state and by providing an adequately large input signal and adequate gain to cause the output to attain these states at normal signal excursions. The current source 35 provides approximately 300μA of current for Q8, Q9, while the current source 33 provides about 130μA of current for Q1, Q2. In the zero signal state, i.e., no IF signal present. Q1 and Q2 conduct equally (65μA each), and Q8 conducts about three-quarters (225μA) of the current from source 35 while Q9 conducts about one-quarter (75μA) of the current from source 35. Since the emitters of Q8, Q9 are joined, this current division is achieved by applying a voltage to the base of Q8 which is larger (by approximately 35 MV) than the voltage applied to the base of Q9. The voltage applied to the base of Q8 is equal to the voltage drop below B+ in the input junction of Q2 at its normal current setting (65μA). The lesser voltage applied to the base of Q9 is substantially (70%) equal to the drop produced by the current established by 35 in the diode D4 connected between The B+ bus 15 and the base of Q9. With a signal of positive polarity present on the base of either transistor Q1 or Q2, a corresponding increase in voltage will appear at the common emitters. Applied to the base of Q8, this increase will cause Q8 to conduct more strongly, increasing its drop in diode D4 and lowering the voltage applied to the base of Q9. A lowered base voltage applied to Q9 will reduce the collector current and cause an increase in collector voltage. In the limiting condition, Q8 becomes fully conductive and Q9 becomes nonconductive. Applied to the base of Q10, this increase in collector voltage tends to reduce the current in Q10 toward cut off.

With both signals applied to the bases of Q1, Q2 of negative polarity, the converse occurs and Q10 is driven into conduction. With the common emitters of Q1, Q2 depressed, Q8 will conduct less strongly and Q9 will conduct more strongly causing a reduction in voltage at the collector of Q9. In the limiting condition, Q8 becomes non-conductive, Q9 becomes conductive and the current in Q10 increases.

In both of the above cases, very substantial limiting occurs when the input signal exceeds 50 or 60 millivolts. When the applied signal is large in respect to this figure, as it should be (typically it is one-half volt peak to peak), the output states of Q9 are of nearly constant amplitude, as shown at 37 in FIG. 3. Thus, the differential amplifier (Q8, Q9) eliminates amplitude variation in the positive state and in the negative state of the detector output, and steepens the transition between states.

Assuming no integration by parasitic capacitances, the output pulses appearing at the collector of Q9 would contain the succession of constant amplitude, nearly rectangular pulses occuring at the intermediate frequency rate shown at 37. There is, however, some integration performed by capacitance appearing in the load circuit of the differential amplifier as a result of the input impedance of the following amplifier Q10. The capacitive effect is insufficient to prevent resolution of the individual pulses as they appear at the collector of Q9. In the degenerative feedback loop fed from the collector of Q9, it merely reduces the bandwidth of the feedback signal. The bandwidth reduction is small and permits the degenerative loop to function with only slightly reduced speed. The regenerative loop on the other hand, is isolated from this capacitive loading and allows rapid switching from one state to the other. The actual output pulses of Q9 thus experience a reduction in rectangularity consistent with some roll-off in the amplification process.

The roll-off is easily determined. The load circuit for the differential amplifier consists in part of the base emitter capacitance of succeeding transistor amplifier Q10 and a small (1K) emitter resistance 29 connecting the emitter of Q10 to B+. The base to emitter capacity of Q10 is several picofarads since it is a laterally formed PNP transistor. Thus, the roll-off is in a doublet form, never introducing more than the 1K emitter load in shunt with the collector load (3.9K) at even the highest frequencies.

In addition to the foregoing, two other integrative effects are present and associated with the transistor amplifier Q10. The first is attributable to the drift time required for the carriers in the laterally formed PNP transistor to reach the collector and the second is the integrative effect produced by the RC network 23, 24. The collector of Q10 from which the output signal is derived is connected to filters 23, 24 at the same point as the collector of the AM detector Q5 (which is quiescent in the FM mode). The PNP transistor Q10 has a relatively low frequency cut-off of several hundred kilocycles. Thus, since the individual pulses of the 10 megacycle IF rate can no longer be resolved, low frequency information is recovered, based on the average pulse width or duty cycle of the pulses. This low frequency information is the audio information in the FM signal. The RC network 23, 24 is selected to provide the required 75$\mu$ sec de-emphasis to reconstitute the original modulating audio signal.

The schematic diagram of FIG. 1 combines the AM and FM circuitry and adds current supply and control circuit details omitted in FIGS. 2 and 3. For instance, the equivalently represented current source 25 of FIG. 2 is shown as a transistor Q4 with a base connection to the mode switch 26 and an emitter connection to ground through resistance 22 in FIG. 1. There are three additional current sources in FIG. 1 operative in the FM mode and inoperative in the AM mode in consequence of the setting of the mode switch 26. Current source 33 of FIG. 3 is shown as the transistor Q6 of FIG. 1 having its collector returned to the emitters of Q1, Q2, its base led to the pad P4 to which a fixed bias supply and filtering is applied and its emitter led through a resistance 43 to an ancillary connection point at a first terminal of a second resistance 44 coupled to the pad P3 at the mode switch 26. Current source 35 of FIG. 3 is the transistor Q7, having its collector coupled to the emitters of differential amplifier Q8, Q9, its base coupled to the pad P4, and its emitter coupled through a second resistance 45 to the first terminal of resistance 44.

A third current source is also provided, not shown in either FIG. 2 or FIG. 3, for readjusting the control output from the demodulator as a function of the mode setting. The third current source is provided by the transistor Q17 having its base returned to the pad P4 at a fixed positive bias, its emitter led through a resistance 48 to the first terminal of resistance 44 and its collector led through a Veb current reference comprising serially connected diode D6 and resistance 48 to the B+ bus.

The third current source (Q17) increases the output current of the AGC, AFC amplifier in the FM mode over that in the AM mode. The emitter of the Q17 source is connected through resistance 44 to the mode switch 26. In the AM setting of the mode switch, transistor Q17 is cut off, but in the FM setting, it is conductive. The transistor Q17 operates to step up the gain in the IF amplifier in the FM mode by increasing the current supplied thereto.

The AGC, AFC control amplifier comprises the transistors Q15, Q16. It is designed to provide an amplified AGC voltage in the AM mode and an amplified AFC voltage in the FM mode. The input stage of the control amplifier includes a transistor Q16, whose base is coupled to both the collector of Q5, at which the detected AM signal appears when the receiver is in the AM mode, and to the collector of Q10, at which the detected FM signal appears when the radio receiver is in the FM mode. The emitter of Q16 is led to ground through resistance 47 and the collector is led through the current reference comprising resistance 48 and diode D6 to the B+ bus. The output stage of the control amplifier includes transistor Q15, whose base is connected to the collector of Q16 and to the Vbe reference (D6, 48), its emitter being led through resistance 49 to the B+ bus. Thus, the Vbe reference establishing the output of the control amplifier in the FM setting reflects both the current from Q16 which is proportional to the average signal level and the current step produced by current source Q17. In the AM setting, the Vbe reference establishing the output of the control amplifier reflects only the average signal level.

The amplified control voltage supplied from the AM and FM detectors and amplified in the control amplifier is used to control the IF amplifier 12 and the AM, FM converter 11. In the AM setting, the gain of the IF amplifier is controlled by the use of current control of the several stages. Also, the gain of the converter 11 and any RF stages may be similarly subject to this or another mode of gain control. In the FM setting, the current level is boosted sufficiently high in the IF amplifier so that gain is essentially unaffected by any changes in the current supplied by Q15 while a variable voltage is applied to the FM oscillator. The FM oscillator is therefore selected so that its frequency characteristic is voltage dependent and voltage dependent in a sense to achieve correction of any drift. A suitable AM, FM converter and a suitable IF amplifier are illustrated in U.S. Pat. application Ser. No. 435,456 of William Peil et al, entitled "AM-FM Receiver Having Improved Filtering", filed Jan. 22, 1974 and now abandoned.

The foregoing FM detector is preferrable to the conventional circuits normally used in integrated circuit fabrication. In integrated circuit or discrete form, the heart of the detector, the differentially connected emitter follower pair, facilitates low distortion in the detection process. In comparison to the known two and four quadrant detection circuits, which introduce 30° to 50° differential phase shift between the signal applied to the lower rank and the quadrature signal applied to the upper rank, the present arrangement introduces no additional differential phase shift. Since the differential phase is signal level sensitive, it causes 5° to 10° variation in phase shift in the cited arrangement. This cause of distortion is eliminated in the present arrangement.

In addition, the present detection arrangement presents a near optimum loading relationship to the tuned circuit. It presents a minimum of loading to the tuned circuit; one that is balanced between the input tank circuit and the output tank circuit; and finally, loading that is essentially constant and independent of signal level. In FM demodulators, the effective Q of the tuned discriminator circuits is reduced by the loading introduced by the active detection elements. Since the loading is not produced by simple diodes, but rather by transistor input junctions, the loading in the present arrangement is less, reducing the loading by a factor corresponding generally to the betas of the transistors. Since the loading is relatively small, the resonant circuits of the FM filter may operate at higher than normal Qs. Since the loading is small, there is a minimum of de-tuning at all signal levels. In addition, due to the shared nature of the conduction cycle, in which the transistors each equally share the conduction intervals in positive or negative phases, the loading effect on both tank circuits is equal. Thus, to the extent that there is load, there is equality between the input and output filters and they may be tuned for normal signal levels. In addition to this equality between input and output circuit loading, the loading on the tuned circuit remains essentially constant since the emitter current, and consequently the base currents, are held to be substantially constant over time by the emitter current source (33).

While the invention has been illustrated using conventional filters for AM and FM operation, it should be understood that other selections may be made. For instance, one may use a delay line for FM operation which is long enough to produce the requisite phase shift. Normally, at the standard frequencies used in FM, this approach is prohibitively expensive. However, at higher frequencies or when other modulating standards are employed, the delay line approach is often practical. In addition, one may use ceramic resonators or in the case of the FM filter 18, one may employ an initial load circuit which is untuned followed by a single tuned secondary. One could also employ surface wave devices for these same purposes.

In the preferred embodiment of the invention, the detectors Q1, Q2 are operated linearly, typically at 130 microamperes, and produce a variable width waveform whose zero crossings are spaced in linear proportion to the frequency deviation of the signal. A zero crossing detector follows the detection diodes and senses the zero crossings and produces a rectangular pulse waveform whose zero crossings match the zero crossings of the waveform derived previously. If the zero crossing detector is not employed, frequency discrimination is still produced by the emitter follower pair. The circuit, however, is subject to sensitivity to amplitude modulation as well. Thus, if one looks at the area of the curve in the negative going direction of FIG. 3, one will see that both the width of the negative going region and also its height are varied. If the input waveform is linear through the frequency domain, then this effect will produce a second order term which would normally appear as detection distortion. However, it is possible to shape the bandpass characteristic of the filter, so that the amplitude falls off suitably (by using a narrower band filter) to compensate for this increased second order term in the detector. Thus, considering both the effect of the filter and of the detection circuit, the amplitude nonlinearity may be compensated out without the need for a following limiting amplifier. However, in certain narrow band applications, or those in which a small amount of distortion is unimportant, compensation may be unnecessary.

In a preferred form of the invention, the amplitude and phase response of the filter 18 is adjusted to extend the range of linearity of the demodulator. In particular, the two tuned circuits are overcoupled to produce the extended phase response (39) illustrated in FIG. 4. The foregoing adjustment leads to a distortion figure of about one-fourth of one percent at optimum overcoupling.

The zero crossing detector may take other forms than the one herein illustrated. In the present preferred configuration, the device has a high gain for low signal levels and is very rapidly driven into a limiting condition by signals of either polarity at 60 or 70 millivolts above or below the bias point. Since the device is normally driven with 500 millivolt peak to peak signals, the normal signal levels achieve essentially hard limiting. Other forms of zero crossing detectors may be employed, including standard regenerative amplifiers. The zero crossing detector amplifier should be nonlinear therefore so as to achieve saturation at low signal excursions of either polarity and when the signal is removed should have no hysteresis so that the amplifier quickly returns to its original bias point.

The detector uses separate audio preamplifier stages, Q5 and Q10 for AM and FM respectively, but utilizes the same final RC network comprising the resistance 23 and the capacitance 24. These values are selected to provide the correct de-emphasis for the usual frequency modulation signal and in many respects, it approximates the desired frequency response for the AM receiver.

What we claim as new and desire to secure by Letters Patent of the United States is:

1. An FM detector comprising:
   a. a source of frequency modulated signals of predetermined center frequency,
   b. phase shift means for producing a substantially linear change of phase with frequency through a range lying to either side of an odd multiple of 90°,
   c. a differentially connected emitter follower pair comprising a pair of transistors, the collectors of both transistors being jointly coupled to a bias source, the emitters of both transistors being jointly coupled to ground through a load impedance, and the base of one transistor being coupled to said source without phase shift and the base of the other transistor being coupled to said source through said phase shift means to produce at the joined emitters an output waveform representing the greater of the two input waveforms and having zero crossing widths proportional to the phase separation of the input waves, said output waveform having a portion of one polarity which is broad and double peaked while having a portion of the other polarity which is narrow and single peaked, and
   d. integrating means coupled to said load impedance for converting said other polarity portions to a time average waveform whose amplitude is proportional to said frequency deviation to obtain the original signal modulation.

2. The combination set forth in claim 1 having in addition thereto a zero crossing detector coupled between said load impedance and said integrating means for detecting the zero crossings bounding said variable width portions of said other polarity and for removing amplitude variations in said portions to form a succession of rectangular pulses having durations substantially equal to the zero crossing intervals.

3. The combination set forth in claim 2 wherein said phase shift means comprises a resonant element producing a phase shift of approximately 90° at said center frequency.

4. The combination set forth in claim 2 wherein said phase shift means comprises a pair of coupled resonant tank circuits producing a phase shift of approximately 90° at said center frequency.

5. The combination set forth in claim 2 wherein said zero crossing detector comprises a pair of transistors having their emitters joined and coupled to a constant current source, the collector of the first transistor being coupled to the base of the second transistor and completing a first regenerative feedback path, said detector reaching one of two limiting conditions at low signal excursions, the input signal being applied to the base of the first transistor and a squared output pulse being derived from the collector of the second transistor.

6. The combination set forth in claim 5 wherein a degenerative feedback loop is provided from the collector of the second transistor to its base for stability.

7. The combination set forth in claim 4 wherein said coupled resonant tank circuits are overcoupled to extend the linear range of the phase response characteristics.

8. An AM-FM detector comprising:
   a. a source selectively providing either frequency modulated signals of a first predetermined center frequency or amplitude modulated signals of a second predetermined center frequency,
   b. phase shift means which for frequency modulated signals produces a substantially linear change of phase with frequency through a range lying to either side of an odd multiple of 90° and which for amplitude modulated signals produces a phase inversion,
   c. a differentially connected emitter follower pair comprising a pair of transistors, the collectors of both transistors being jointly coupled to a bias source; the emitters of both transistors being jointly coupled to ground through a load impedance, and the base of one transistor being coupled to said source without phase shift and the base of the other transistor being coupled to said source through said phase shift means to produce at the joined emitters an output waveform representing the greater of the two input waveforms and having zero crossing widths proportional to the phase separation of the input wave;
   whereby for FM operation an output wave-form is provided having a portion of one polarity which is broad and double peaked while having a portion of the other polarity which is narrow and single peaked, and whereby for AM operation full wave rectification is achieved; and
   d. integrating means coupled to said load impedance which for FM operation converts said variable width portions of said other polarity to a time averaged waveform whose amplitude is proportional to said frequency deviation to obtain the original signal modulation and which for AM operation derives the average amplitude of said full wave rectified signal to obtain the original signal modulation.

9. The combination set forth in claim 8 having in addition thereto a zero crossing detector operable in the FM mode coupled between said load and said integrating means for detecting the zero crossings bounding said variable width portions of said other polarity and for removing amplitude variations in said portions to form a succession of rectangular pulses having durations substantially equal to the zero crossing intervals.

10. The combination set forth in claim 9 wherein said phase shift means comprises a resonant element producing a phase shift of approximately 90° at said FM center frequency.

11. The combination set forth in claim 9 wherein said phase shift means comprises a pair of coupled resonant tank circuits producing a phase shift of approximately 90° at said FM center frequency.

12. The combination set forth in claim 9 wherein said zero crossing detector comprises a pair of transistors having their emitters joined and coupled to a constant current source, the collector of the first transistor being coupled to the base of the second transistor and completing a first regenerative feedback path, said detector reaching one of the two limiting conditions at low signal excursions, the input signal being applied to the base of the first transistor and a squared output pulse being derived from the collector of the second transistor.

13. A frequency modulation detector responsive to frequency modulated signals of predetermined center frequency, comprising:
   a. a pair of transistors each having an emitter, base and collector electrode, the collector electrodes being connected to a bias source and the emitter electrodes being joined together and connected to a load impedance,
   b. first input means for applying said frequency modulated signals to the base electrode of one of said transistors, said frequency modulated signals being in the form of a first input waveform,
   c. second input means for applying said frequency modulated signals that have been shifted in phase so as to exhibit a substantially linear change of phase as a function of frequency through a range lying to either side of an odd multiple of 90° to the base electrode of the other of said transistors, the phase shifted frequency modulated signals being in the form of a second input waveform, said first and second transistors conducting in accordance with the predominant one of said first and second input waveforms so as to generate an output waveform at said load impedance which represents the predominant one of the two input waveforms and which intersects an established reference level with reference level crossing widths that are a function of the relative phase of said two input waveforms,
   d. integrating means coupled to said load impedance for converting the output waveform to a time averaged waveform whose amplitude is proportional to said relative phase and therefore the frequency deviation of said signals, and
   e. limiting means coupled between said load impedance and said integrating means for removing amplitude variations in said output waveform.

14. The combination set forth in claim 13 wherein said first and second input means also serve to apply said bias source to said base electrodes for establishing said reference level at said load impedance.

15. The combination set forth in claim 14 wherein said pair of transistors present a high input impedance at their base electrodes to said first and second input waveforms.

16. The combination set forth in claim 15 wherein the value of said reference level corresponds to the condition of zero input signal applied to said pair of transistors so that the intersections of said reference level by said output waveform become zero crossings.

17. The combination set forth in claim 16 wherein said limiting means includes a zero crossing detector for detecting the zero crossings bounding variable width portions of said output waveform and forming a succession of alternate broadwidth and narrow width rectangular pulses having durations substantially equal to the zero crossing intervals.

18. The combination set forth in claim 17 wherein said integrating means provides a time averaged waveform of said narrow width pulses.

19. The combination set forth in claim 17 wherein said load impedance comprises a constant current source.

20. The combination set forth in claim 19 wherein said pair of transistors are each poled so as to conduct in accordance with the more positive valued one of said first and second input waveforms.

21. The combination set forth in claim 20 wherein said transistors are of NPN type.

22. The combination set forth in claim 21 wherein said zero crossing detector comprises a pair of transistors having their emitters joined and coupled to a second constant current source, the collector of the first transistor being coupled to the base of the second transistor and completing a first regenerative feedback path, said detector reaching one of two limiting conditions at low signal excursions, said output waveform being applied to the base of the first transistor and a squared output pulsed waveform being derived from the collector of the second transistor.

23. The combination set forth in claim 22 wherein a degenerative feedback loop is provided from the collector of said second transistor to its base for stability.

* * * * *